(12) United States Patent
Johnston et al.

(10) Patent No.: US 6,272,588 B1
(45) Date of Patent: Aug. 7, 2001

(54) METHOD AND APPARATUS FOR VERIFYING AND CHARACTERIZING DATA RETENTION TIME IN A DRAM USING BUILT-IN TEST CIRCUITRY

(75) Inventors: Thomas Kevin Johnston; Grady Lawrence Giles, both of Austin; William Daune Atwell, Spicewood, all of TX (US)

(73) Assignee: Motorola Inc., Schaumburg, IL (US)

(*) Notice: Subject to any disclaimer, the term of this patent is extended or adjusted under 35 U.S.C. 154(b) by 0 days.

(21) Appl. No.: 08/865,510

(22) Filed: May 30, 1997

(51) Int. Cl.$^7$ ........................................... G06F 11/34
(52) U.S. Cl. .................. 711/106; 365/222; 365/201; 714/721; 714/718; 711/105
(58) Field of Search ....................... 711/105, 106, 711/167, 201, 210, 217, 203; 326/37, 38; 361/684; 365/203, 201, 222, 225.7; 714/718, 743, 721

(56) References Cited

U.S. PATENT DOCUMENTS

| | | |
|---|---|---|
| 4,954,951 * | 9/1990 | Hyatt ..................................... 711/218 |
| 5,173,906 | 12/1992 | Dreibelbis et al. . |
| 5,224,101 | 6/1993 | Popyack, Jr. . |
| 5,265,102 * | 11/1993 | Saito ..................... 714/743 |
| 5,325,367 | 6/1994 | Dekker et al. . |
| 5,349,562 * | 9/1994 | Tanizaki ................. 365/222 |
| 5,383,195 | 1/1995 | Spence et al. . |
| 5,402,390 * | 3/1995 | Ho et al. ............................ 365/225.7 |
| 5,410,510 * | 4/1995 | Smith et al. .......... 365/201 |
| 5,566,117 * | 10/1996 | Okamura et al. .......... 365/222 |
| 5,844,914 * | 12/1998 | Kim et al. .............................. 714/718 |

* cited by examiner

*Primary Examiner*—Behzad James Peikari
(74) *Attorney, Agent, or Firm*—Lee E. Chastain; Robert L. King

(57) ABSTRACT

A BIST controller (112) and methodology uses the DRAM controller (108) refresh signals to test the data retention characteristics of a DRAM memory array (132). The BIST controller blocks a fraction of the refresh cycles generated by the DRAM controller to provide a margin of confidence above the DRAM's specified retention time. The BIST controller is especially suited to embedded applications in which access to the memory is indirect and to applications in which the memory system is modular. The invention may also be used to characterize the actual retention time of a particular DRAM allowing the system to optimize the DRAM's refresh interval.

11 Claims, 7 Drawing Sheets

METHOD AND APPARATUS FOR VERIFYING AND CHARACTERIZING DATA RETENTION TIME IN A DRAM USING BUILT-IN TEST CIRCUITRY

FIELD OF THE INVENTION

The present invention generally relates to integrated electronic circuits, and more specifically to methods and devices for testing such circuits.

SUMMARY OF THE INVENTION

In accordance with the present invention, there is disclosed an apparatus and a method of verifying and characterizing data retention in a DRAM using built-in test circuitry which substantially eliminates disadvantages of known DRAMs.

The apparatus includes a DRAM periodically requiring a refresh operation to retain valid data, refresh control circuitry, and built-in test circuitry. The refresh circuitry initiates a refresh operation to satisfy a data retention time specification for the DRAM. The built-in test circuitry modifies a rate at which the refresh control circuitry performs the refresh operation in order to verify the actual data retention time of the DRAM. The method includes the steps of operating a DRAM to selectively modify a rate at which the refresh control circuitry performs the refresh operation.

BACKGROUND OF THE INVENTION

A common and well known test methodology for integrated circuits is Built-In Test (BIT) or Built-In-Self Test (BIST) which uses a dedicated portion of the integrated circuit to determine if the integrated circuit is free of manufacturing defects. BIST circuitry often generates stimulus for the circuitry under test. The tested circuitry generates responses to be compared by the BIST circuitry with expected responses. A result of the comparison is provided by the BIST circuitry for use by a manufacturer or user of the integrated circuit.

One particularly well-suited application of BIST is with memories due to the repetitive structures often found in memories. Dynamic Random Access Memories (DRAMs) have most of the same test requirements as Static Random Access Memories (SRAMs) but with an additional requirement of testing the data retention time specification. DRAMs are specified to have a maximum interval over which all rows must be refreshed. In particular, DRAMs have a characteristic that all read operations and all write operations have the effect of refreshing the row which is accessed. For normal system operation, this characteristic ensures that data is not destroyed by these accesses, but in no manner does it lessen the need to maintain the schedule of regular refreshing due to the random nature of the accesses in normal system operation. A production test of a DRAM must verify that refresh operations which are provided at the minimum specified rate are sufficient to ensure that the DRAM reliably retains all the data which has been stored.

Previous BIST architectures have generated a test sequence for testing memories. In one example, the test sequence is stored in ROM and therefore is programmable. An example of such a test architecture is disclosed in U.S. Pat. No. 5,173,906 entitled "Built-In Self Test for Integrated Circuits". Another programmable test architecture is taught in U.S. Pat. No. 5,224,101 entitled "Micro-Coded Built-In Self Test Apparatus for a Memory Array". Microcode is used to provide a delay period for data retention determined by a program stored in a Microcode ROM. However, this delay interval is subject to the clock frequency of the Built-In Test circuitry and is implemented as a counter clocked at a sequencer's clock rate.

If the test method provided for an embedded DRAM is Built-In-Self-Test (BIST), there is a problem that BIST circuitry is generally a finite state machine (FSM) which is designed to execute a predetermined sequence of states to stimulate the memory and evaluate the responses of the memory. State transitions in the predetermined BIST sequence are generally synchronous with one or more clock inputs. This clocking source is generally the same as is used for other circuitry with which the embedded DRAM is integrated. Thus, if a predetermined BIST sequence includes a refresh interval test, then the duration of the refresh interval which is produced by the BIST FSM will be directly related to the frequency of the BIST clocking source, whereas the function which must be guaranteed by the test is a specified data retention interval unrelated to the BIST clocking frequency.

Other circuitry with which the embedded DRAM is integrated (e.g. data processor circuitry) is generally designed and specified to operate reliably over a range of clock frequencies. If the BIST is to operate over the same range of frequencies as the other circuitry with which the embedded DRAM is integrated, there exists a problem of the BIST data retention interval being dependent on the clock frequency, particularly when a maximum data retention interval is being tested. Frequency dependency results in difficulty in applying a data retention interval test for a specific duration.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF THE PREFERRED EMBODIMENT

Figure 1:
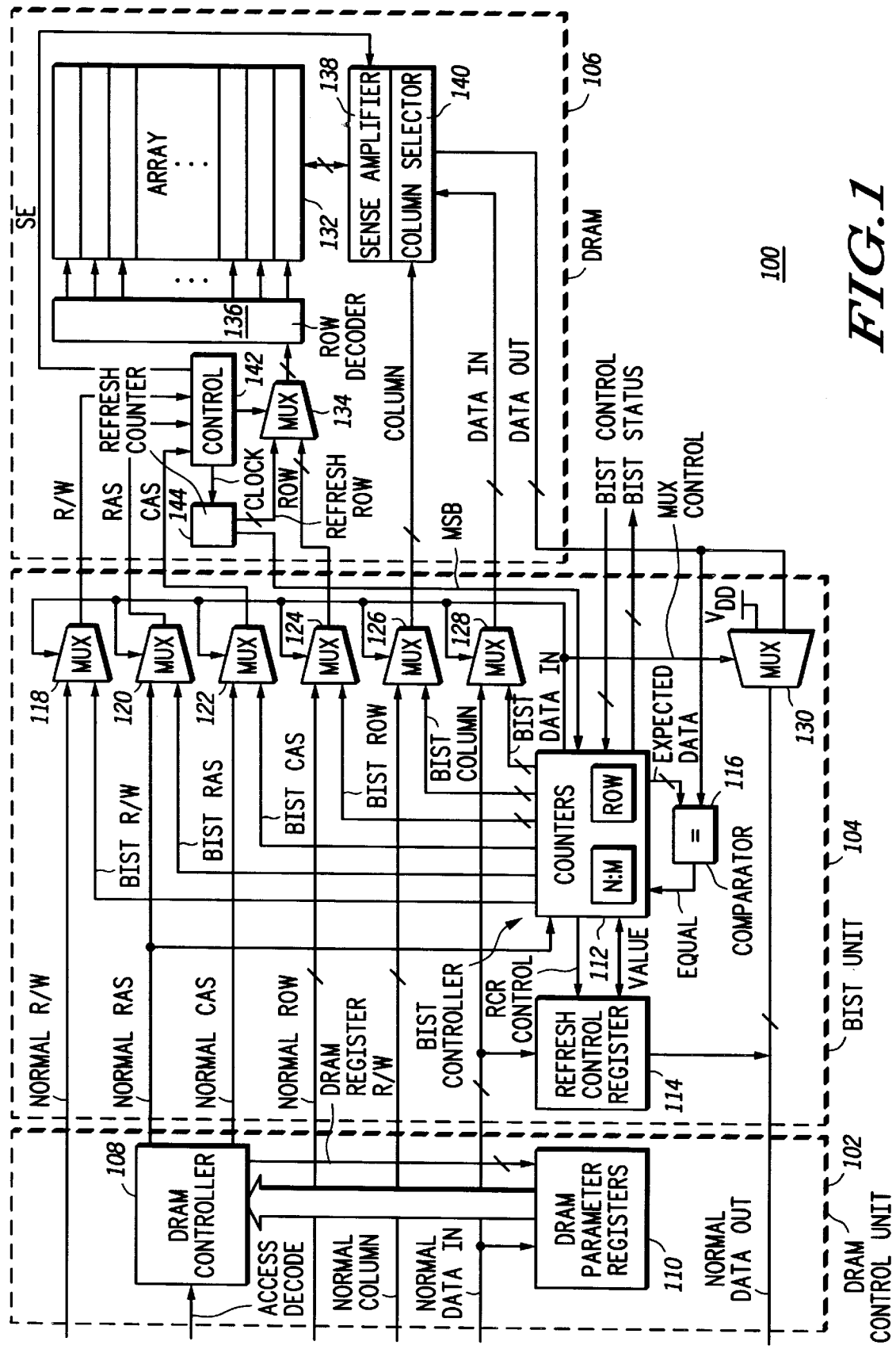
FIG. 1 depicts a block diagram of a memory system constructed in accord with the present invention.

FIG. 1 depicts a block diagram of a memory system 100 constructed in accordance with the present invention. Memory system 100 includes a dynamic random access memory (DRAM) control unit 102, a built-in self-test (BIST) unit 104 and a DRAM 106. BIST unit 104 automatically tests the data readability, data writability, and data retention characteristics of DRAM 106. Such a test ensures that DRAM 106 and memory system 100 operate correctly.

BIST unit 104 can verify that the data retention characteristics of DRAM 106 meet a specified minimum time. Further, BIST unit 104 incorporates a second mode of operation in which it can determine the actual data retention characteristics of a particular memory system. Then, BIST unit 104 or an associated data processor can increase the refresh time of the DRAM to minimize power consumption and maximize bandwidth given the characteristics of a particular DRAM. BIST unit 104 can test the data retention time of an associated DRAM array independent of the frequency of the clock which controls BIST unit 104. BIST unit 104 relies on the normal refresh functionality of DRAM control unit 102. Although BIST unit 104 is powerful, it does not change the interface between a conventional DRAM controller and a conventional DRAM. Consequently, BIST unit 104 can easily be incorporated into existing architectures and into modular design methodologies. BIST unit 104 is well suited to embedded applications in which memory is not directly accessible to the user.

Memory System Connectivity

Continuing with FIG. 1, DRAM control unit 102 comprises a DRAM controller 108 and DRAM parameter registers 110. DRAM controller 108 receives the input ACCESS DECODE from an external device and the contents of DRAM parameter registers 110. DRAM controller 108 generates the outputs row address strobe (RAS), column address strobe (CAS), and DRAM REGISTER READ/WRITE (R/W). DRAM parameter registers 110 are coupled to the data input NORMAL DATA IN and to the control signal DRAM REGISTER R/W. DRAM parameter registers 110 are described below in connection with FIG. 2, BIST unit 104 comprises a BIST controller 112, a Refresh Control Register (RCR) 114, a comparator 116, and seven 2:1 multiplexors (MUXs) 118, 120, 122, 124, 126, 128, and 130. BIST controller 112 is generally a finite state machine (FSM) which is designed to execute a predetermined sequence of states to stimulate and evaluate the responses of DRAM 106. BIST controller 112 itself comprises two counters: an N:M counter and a ROW counter. The N:M counter is clocked by the NORMAL RAS control signal. The ROW counter is clocked by an output of DRAM 106, MSB. BIST unit 104 receives as inputs various BIST CONTROL signals from a data processor, microcontroller, digital signal processor, etc.: BIST ENABLE and BIST REGISTER SELECT. BIST unit 104 generates various BIST STATUS signals output to the data processor, microcontroller, digital signal processor, etc.: BIST COMPLETE and BIST PASS. Within BIST unit 104, BIST controller 112 generates the control and data signals: BIST R/W, BIST RAS, BIST CAS, BIST ROW, BIST COLUMN, BIST DATA IN, MUX CONTROL, EXPECTED DATA, and several REFRESH CONTROL REGISTER (RCR) CONTROL signals. Also, BIST controller 112 receives the internal control signal EQUAL from comparator 116 and is bi-directionally coupled to refresh control register 114 via VALUE. Refresh control register 114 is described below in connection with FIG. 2.

A first input of MUXs 118, 120, 122, 124, 126, 128, and 130 receives BIST R/W, BIST RAS, BIST CAS, BIST ROW, BIST COLUMN, BIST DATA IN, and a voltage supply corresponding to a predetermined logic level, VDD, respectively. A second input of MUXs 118, 120, 122, 124, 126, 128, and 130 receives NORMAL R/W, NORMAL RAS, NORMAL CAS, NORMAL ROW, NORMAL COLUMN, NORMAL DATA IN, and DATA OUT, respectively. MUXs 118, 120, 122, 124, 126, 128, and 130 generate the signals R/W, RAS, CAS, ROW, COLUMN, DATA IN, and NORMAL DATA OUT, respectively. The output of each of MUXs 118, 120, 122, 124, 126, 128, and 130 is controlled by the control signal MUX CONTROL.

Comparator 116 receives EXPECTED DATA and DATA OUT for comparison and generates the control signal EQUAL in response to the equality or inequality of the comparison. A data input and a data output of refresh control register 114 is coupled to NORMAL DATA IN and to NORMAL DATA OUT, respectively.

DRAM 106 comprises an array 132, a MUX 134, a row decoder 136, a sense amplifier, 138, a column selector 140, a control unit 142, and a refresh counter 144. In the depicted embodiment, array 132 comprises one hundred and twenty-eight rows selected by the output of row decoder 136. Row decoder 136 receives an output of a MUX 134. MUX 134 receives an output of refresh counter 144, REFRESH ROW, and an input ROW. An output of MUX 134 is selected by a control signal output by control unit 142. Control unit 142 receives the outputs of MUXs 118, 120, and 122 and outputs control signals CLOCK and sense enable SE. Refresh counter 144 receives the control signal CLOCK. The most significant bit of refresh counter 144 is output as MSB. An output of array 132 is coupled to sense amplifier 138. An output of sense amplifier 138 is coupled to column selector 140. Column selector 140 also receives the output of MUX 128 and the control signal SE. Column selector 140 outputs its data to an external device through DATA OUT and MUX 130.

Overview of Memory System Operation

In operation, memory system 100 has a normal mode of operation and a test mode of operation. In the normal mode of operation, a data processor, microcontroller, digital signal processor, etc. writes data to and reads data from DRAM 106 responsive to program instructions. In the test mode of operation, BIST unit 104 performs two general classes of tests upon DRAM 106: pattern test and refresh test. Further, the refresh test itself has a first and a second mode of operation.

Normal Mode of Operation

Continuing with the normal mode of operation, MUXs 118, 120, 122, 124, 126,128, and 130 are configured to pass NORMAL R/W, NORMAL RAS, NORMAL CAS, NORMAL ROW, NORMAL COLUMN, NORMAL DATA IN, and DATA OUT, respectively. Memory system 100 is initially configured with various parameters that define its operating characteristics. An intelligent actor stores these parameters into DRAM parameter registers 110 when the data processing system incorporating memory system 100 powers up. These parameters are written to particular ones of DRAM parameter registers 110 by asserting particular combinations of the ACCESS DECODE signals and by placing the desired parameter values onto the input NORMAL DATA IN. Thereafter, memory system 100 either stores provided data into array 132 or outputs previously stored data from array 132. Interspersed therewith, DRAM controller 108 periodically issues refresh signals to DRAM 106 to ensure that stored data is not lost over time by normal current leakage.

In a read operation, the intelligent actor places the desired data address onto the NORMAL ROW and NORMAL COLUMN signals, asserts the NORMAL R/W signal, and asserts a valid ACCESS DECODE signal. Control unit 142 selects ROW to be coupled to row decoder 136 via MUX 134. The ACCESS DECODE signal indicates that the address on the NORMAL ROW and NORMAL COLUMN signals is actually intended for memory system 100. Typically, memory system 100 is not connected to all of the address signals in a data processing system. DRAM controller 108 then generates a first pattern of values on NORMAL RAS and NORMAL CAS to cause array 132 to output a proper superset of the desired data. Control unit 142 enables sense amplifier 138 by asserting the control signal SE. Sense amplifier 138 senses and amplifies the data superset, outputting it to column selector 140. Column selector 140 parses the data superset to the specified portion and outputs it to the intelligent actor via DATA OUT.

In a write operation, the intelligent actor places the desired data and destination data address onto the NORMAL DATA IN, NORMAL ROW and NORMAL COLUMN signals, de-asserts the NORMAL R/W signal, and asserts a valid ACCESS DECODE signal. Control unit 142 selects ROW to be coupled to row decoder 136 via MUX 134. Column selector 140 routes the input data to the correct columns within array 132. DRAM controller 108 then generates the first pattern of values on NORMAL RAS and NORMAL CAS to cause array 132 to store the input data to array 132. Control unit 142 enables sense amplifier 138 by asserting the control signal SE. Sense amplifier 138 drives the input data into the memory cells specified by the intersection of the NORMAL ROW and NORMAL COLUMN values and restores the existing data of the non-accessed columns in the same row.

In a refresh operation, DRAM controller 108 asserts a second pattern of values on NORMAL RAS and NORMAL CAS to signal to DRAM 106 that it should begin a refresh operation. DRAM controller 108 signals such an action responsive to the contents of the DRAM parameter registers 110. BIST controller 112 selects NORMAL RAS and NORMAL CAS to be coupled to RAS and CAS via MUXs 120 and 122, respectively. Control unit 142 selects the output of refresh counter 144, REFRESH ROW, to be coupled to row decoder 136 via MUX 134 and asserts the control signal SE. Array 132 then couples the row indexed by refresh counter 144 to sense amplifier 138. Sense amplifier 138 will sense the values stored in the indexed row, will amplify the values, and will drive the amplified values back into the indexed row. Control unit 142 will increment refresh counter 144 by pulsing CLOCK in preparation for the next refresh cycle. In the depicted embodiment, array 132 comprises one hundred and twenty-eight rows of memory bit cells. Consequently, DRAM controller 108 must assert the second pattern on NORMAL RAS and NORMAL CAS one hundred and twenty-eight times within a certain time interval to refresh array 132.

Test Mode of Operation, Pattern Test

Continuing with the test mode of operation, BIST unit 104 typically tests each memory bit cell in array 132 when it is initially powered-up. Generally, logic (not shown) associated with memory system 100 asserts the control signal BIST ENABLE to initiate a test after power-on-reset (POR). However, it should be appreciated that BIST testing may occur at other time(s), as appropriate. BIST controller 112 causes MUXs 118, 120, 122, 124, 126, 128, and 130 to pass BIST R/W, BIST RAS, BIST CAS, BIST ROW, BIST COLUMN, BIST DATA IN, and $V_{DD}$, respectively. BIST controller 112 performs a series of test reads and test writes with test data to verify the functionality of each memory bit cell.

BIST controller 112 varies the test data pattern, the operation order (read/write or write/read), and the address sequence (ascending or descending) to detect as many failures as possible. In one embodiment of the invention, BIST controller 112 tests each memory entry with a pattern of all ones, all zeros, and alternating ones and zeros. Other patterns are known in the art.

BIST controller 112 generates test reads and test writes in a manner similar to the normal reads and normal writes described above. Here, however, BIST controller 112 provides the R/W, RAS, CAS, ROW, COLUMN, and DATA IN values via its outputs BIST R/W, BIST RAS, BIST CAS, BIST ROW, BIST COLUMN, and BIST DATA IN. In one embodiment of the invention, BIST controller 112 contains a counter (not shown) to sequence the various operations of a BIST test. In particular, certain bits of the counter control which pattern is applied to array 132, certain bits of the counter control which values are applied to BIST ROW, certain bits of the counter control which values are applied to BIST COLUMN, etc. In this manner, all necessary combinations of address, pattern, etc., can be easily generated.

BIST controller 112 verifies the functionality of each memory bit cell by comparing the DATA OUT value with an EXPECTED DATA in comparator 116. If the two values are equivalent, then comparator 116 asserts the control signal EQUAL, indicating a successful test. If the two values are not equivalent, then comparator 116 de-asserts the control signal EQUAL, indicating a failing test.

Test Mode of Operation. Refresh Test, Verify Retention

BIST unit 104 tests the data retention characteristics of each memory bit cell in array 132. In a first data retention test mode, BIST unit 104 determines if DRAM 106 meets or exceeds a specification by performing a single pass/fail test. In one embodiment, this data retention test occurs after the BIST pattern tests described above. In other embodiments, it may be separately initiated by a unique control signal. In DRAMs, the charge stored in each memory bit cell tends to dissipate or "leak" over time, corrupting the value of the data. A data retention test determines if the data stored in a memory endures for a minimum time greater than or equal to a specified "retention time" period. Consequently, if every memory bit cell is refreshed at least once in every retention time period, then the stored value will be reliable.

Initially, BIST controller 112 allows at least one refresh to occur after storing known values into array 132. In one embodiment of the invention, BIST controller 112 begins a retention test with the last pattern generated in the BIST pattern test described above. BIST controller 112 allows normal refresh operations to occur by de-asserting the MUX CONTROL signal, allowing the NORMAL RAS and NORMAL CAS signals to reach DRAM 106.

Next, BIST controller 112 interrupts the normal refresh operations of DRAM controller 108 to effectively reduce the refresh rate. BIST controller 112 interrupts the normal refresh operations of DRAM controller 108 by reasserting the MUX CONTROL signal to block the NORMAL RAS and NORMAL CAS signals from reaching DRAM 106. BIST controller 112 reduces the effective refresh rate by interrupting the normal refresh operation N times in every (M+N) refreshes, where N and M are integers. This $$\left(\frac{1}{1+N/M}\right) * \text{normal refresh rate,}$$

corresponding to a tested retention time of (1+N/M) * normal retention time. One embodiment of an N:M counter is described in Pending U.S. application Ser. No. 08/674,381, entitled "A Counter Having Programmable Periods and Method Therefor," incorporated herein by reference. This particular N:M counter regularly spaces the N interruptions over the (M+N) refresh operations generated by DRAM controller 108.

After some number of refreshes of every row of array 132, BIST controller 112 re-asserts the MUX CONTROL signal to access array 132. BIST controller 112 determines that DRAM controller 108 has completed a refresh operation of every row in array 132 by monitoring the most significant bit (MSB) output by refresh counter 144. As described above, refresh counter 144 is incremented by one by control unit 142 each time a refresh operation occurs. Therefore, the ROW counter in BIST controller 112 is incremented each time DRAM 106 cycles through every row. In other embodiments, the ROW counter may count each refresh operation not masked by BIST controller 112. When this count equaled the number of rows in array 132, then a refresh of every row would be complete. BIST controller 112 compares the DATA OUT values with an EXPECTED DATA value as described above. If DATA OUT and EXPECTED DATA are identical, then the effective refresh rate did not exceed the retention time. If the two values differ, then the effective refresh rate exceeded the retention time.

Test Mode of Operation Refresh Test, Characterize Retention

In a second data retention test mode, BIST unit 104 determines the actual retention time of DRAM 106 by performing a series of pass/fail tests. In one embodiment, this second mode is selected by setting a particular bit in refresh control register 114 to a logic one value. In this second mode, BIST controller 112 performs a first data retention test using a first value of N and M. Then, BIST controller 112 alters the values of N and/or M depending upon whether the previous test passed or failed and the search algorithm used.

In one embodiment, BIST controller 112 uses a linear search algorithm. In a linear search algorithm, BIST controller 112 sets N equal to one and M equal to the number of rows in array 132. BIST controller 112 then performs a test with these values of N and M. If array 132 passes, then BIST controller 112 increments N and performs the test again. This process continues until N equals M or until array 132 fails. At the end of the test, BIST controller 112 writes the last value of N into refresh control register 114.

In another embodiment, BIST controller 112 uses a binary search algorithm in the second data retention test mode. This algorithm is more fully described below in connection with FIGS. 6 and 7. BIST controller 112 also writes the last value of N into refresh control register 114.

The user of a system incorporating memory system 100 may use the final value of N to adjust the refresh rate programmed in DRAM parameter registers 110. Such an adjustment allows a user to minimize the bandwidth allocated to the refresh operations and to minimize the power consumed by the refresh operations.

The test mode of operation is further described in connection with FIGS. 3 through 7.

Figure 2:
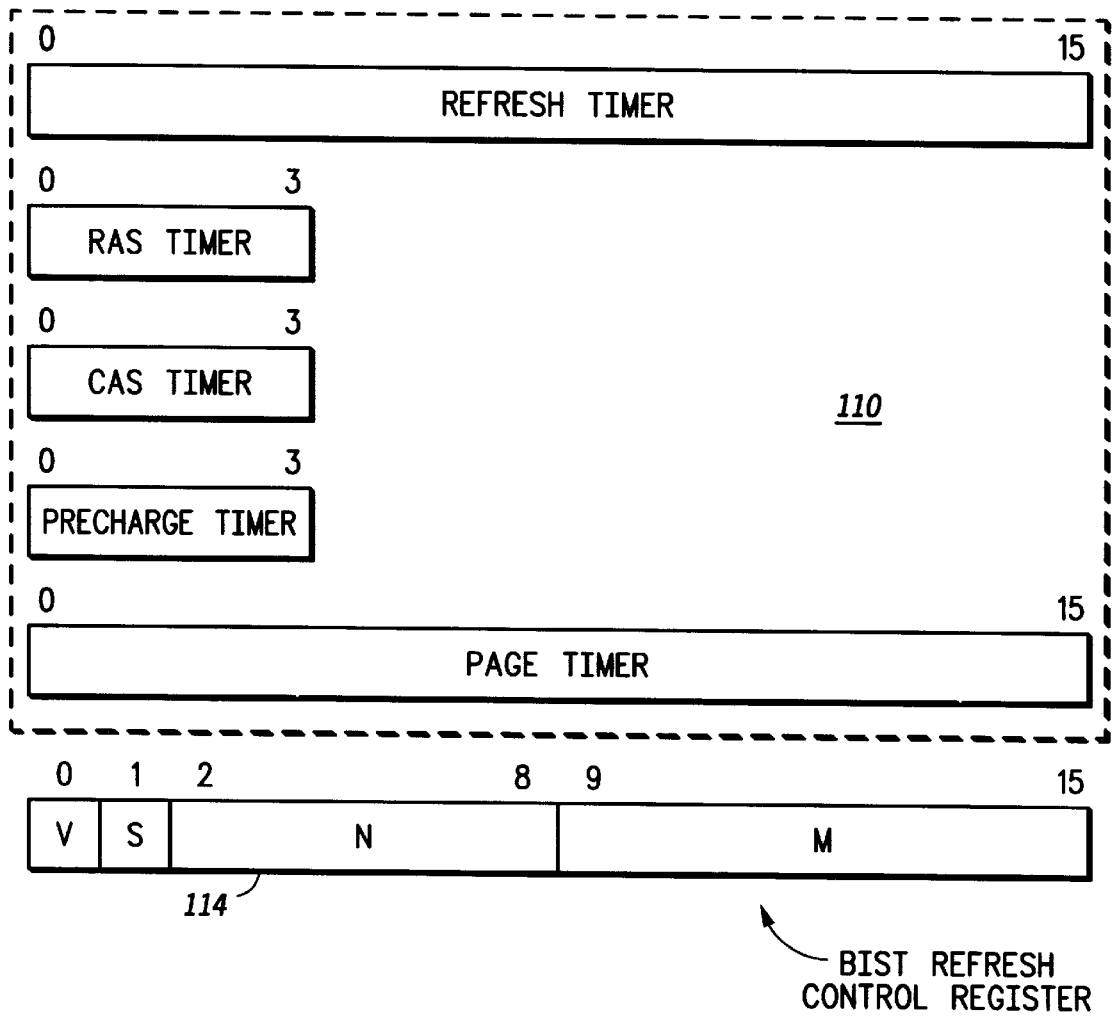
FIG. 2 depicts a conceptual representation of the programmable registers of the memory system illustrated in FIG. 1.

FIG. 2 depicts a conceptual representation of the programmable registers of memory system 100 illustrated in FIG. 1. A REFRESH TIMER register, a RAS TIMER register, a CAS TIMER register, a PRECHARGE TIMER register, and a PAGE TIMER register are incorporated into DRAM parameter registers 110. A BIST REFRESH CONTROL REGISTER is embodied in refresh control register 114. These registers are visible and programmable to the user of memory system 100. In other embodiments, these registers may be hardwired by the manufacturer of memory system 100 to permanent values.

The REFRESH TIMER register, RAS TIMER register, CAS TIMER register, PRECHARGE TIMER register, and PAGE TIMER register are generally known in the art. The value stored in the REFRESH TIMER register controls the rate at which DRAM controller 108 initiates refresh operations to DRAM 106. The value stored in the RAS TIMER register controls the minimum assertion width of the NORMAL RAS signal. The value stored in the CAS TIMER register controls the minimum assertion width of the NORMAL CAS signal. The value stored in the PRECHARGE TIMER register controls the minimum de-assertion width of the NORMAL RAS signal. The value stored in the PAGE TIMER register controls the maximum assertion width of the NORMAL RAS signal. A user selects each of these values consistent with the design specifications of the chosen DRAM.

The BIST REFRESH CONTROL register 114 is a sixteen-bit register having four fields: a one-bit valid field (V), a one-bit sweep field (S), a seven-bit N field, and a seven-bit M field. When V equals zero, then BIST controller 112 performs no retention test. When V equals one, then BIST controller 112 performs a retention test, depending upon the value of the S field. If the S field equals zero, then BIST controller 112 performs a single data retention verify test with the values of N and M loaded into the N and M fields. If the S field equals one, then BIST controller 112 performs a series of data retention tests to characterize DRAM 106. The values stored in the N and M fields are described above.

Figure 3:
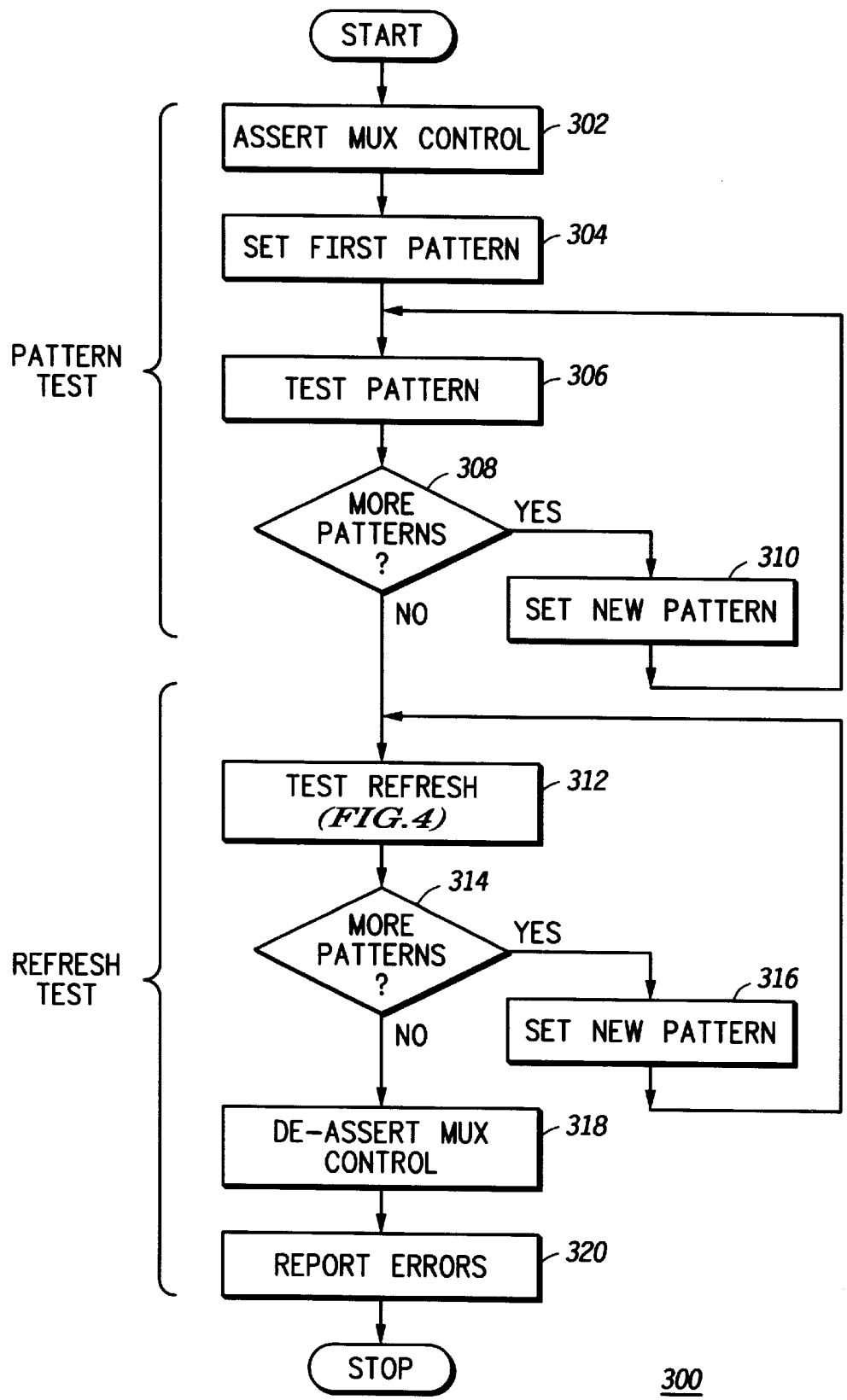
FIG. 3 depicts a flow diagram of the operation of the built-in self-test controller illustrated in FIG. 1.

FIG. 3 depicts a flow diagram 300 of the operation of BIST controller 112 illustrated in FIG. 1. Here, V equals one and S equals zero. Consequently, BIST controller 112 will perform a single data retention test after performing all pattern tests. If V equaled zero, then BIST controller 112 would not perform the steps generally labeled "REFRESH TEST." If S equaled one, then BIST controller 112 would perform the steps depicted in FIG. 6 in place of the instructions generally labeled "REFRESH TEST."

Flow diagram 300 begins when BIST controller 112 asserts the MUX CONTROL signal, a step 302. The assertion of the MUX control signal couples BIST controller 112 to DRAM 106. BIST controller 112 selects a first pattern, a step 304. Such a pattern may consist of all ones, all zeros, or alternating zeros and ones. BIST controller 112, then applies this pattern to array 132, reads array 132 and determines if the stored value equaled the expected value, a step 306. BIST controller 112 then determines if there are any more patterns to apply to array 132, a step 308. If there are more patterns to apply to array 132, then BIST controller 112 sets a new pattern, a step 310, and returns to step 306.

If there are no more patterns to test, then BIST controller 112 performs a data retention test using the last pattern stored in step 306, a step 312. Step 312 is described below in connection with FIG. 4. BIST controller 112 then determines if there are any more patterns to apply to array 132, a step 314. If there are more patterns to apply to array 132, then BIST controller 112 sets a new pattern, a step 316, and returns to step 312. If there are no more patterns to test, then BIST controller 112 de-asserts the MUX CONTROL signal, a step 318. The de-assertion of the MUX control signal recouples DRAM controller 108 to DRAM 106.

BIST controller 112 reports any errors, a step 320, completing flow diagram 300. BIST controller 112 reports errors by asserting its output BIST COMPLETE, by selectively asserting BIST PASS. BIST controller 112 asserts BIST PASS if there were no errors in the previous series of tests.

Figure 4:
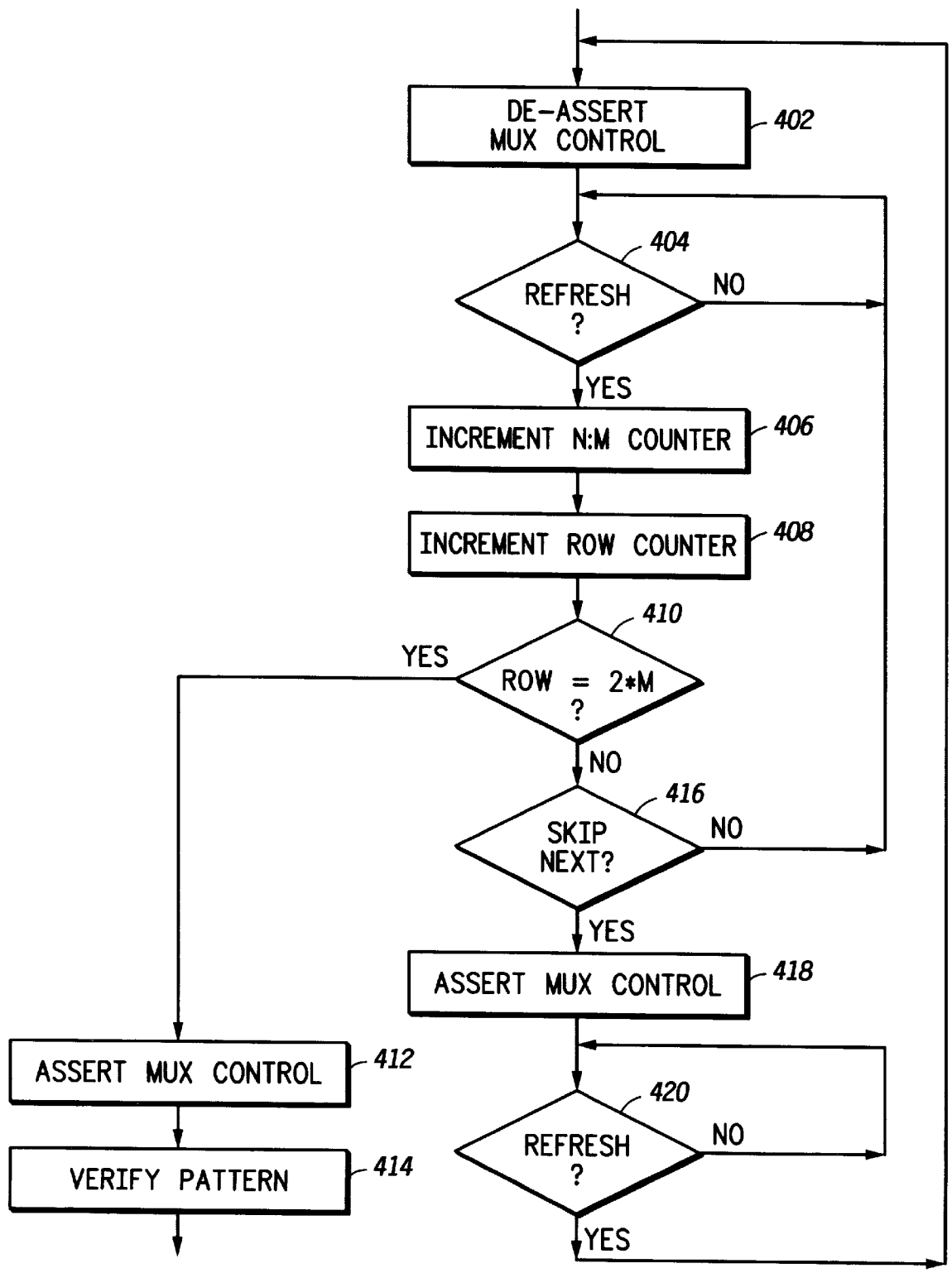
FIG. 4 depicts a flow diagram of one step illustrated in FIG. 3.

FIG. 4 depicts a flow diagram 400 of step 310 illustrated in FIG. 3. In flow diagram 400, BIST controller 112 performs a single data retention test. Initially, BIST controller 112 allows normal refresh operations by de-asserting the MUX CONTROL signal, a step 402. As described above, the de-assertion of the MUX CONTROL signal couples the NORMAL RAS and NORMAL CAS signals to DRAM 106. BIST controller 112 waits for a refresh operation from DRAM controller 108, a step 404. DRAM controller 108 detects a refresh request by monitoring NORMAL RAS. (In other embodiments, BIST controller may monitor other signals which indicate a refresh cycle.) BIST controller 112 increments the N:M counter once it detects a refresh cycle, a step 406.

BIST controller 112 increments the ROW counter, a step 408. Then, BIST controller 112 determines if it has allowed each memory entry to be refreshed twice, a step 410. If BIST controller 112 has allowed each memory entry to be refreshed twice, then BIST controller 112 asserts the MUX CONTROL signal to take control of DRAM 106, a step 412. Once in control, BIST controller 112 verifies that the stored data is equal to the expected data, a step 414. The data retention test is now complete and flow diagram 400 returns to FIG. 3.

If BIST controller 112 has not yet allowed each memory entry to be refreshed twice, then it continues to a step 416. Steps 408 and 410 depict a series of steps operable with a ROW counter that counts each refresh operation passed to DRAM 106. As described above, another embodiment of the invention only monitors the MSB of the refresh counter 144. In such an embodiment, steps 408 and 410 would count at least four transitions of the MSB signal before branching to step 412.

Continuing with step 416, BIST controller 112 determines if it should interrupt or "skip" the next normal refresh cycle, a step 416. BIST controller 112 determines if it should skip the next normal refresh cycle based on the value of the N:M counter. As described above, the N:M counter inserts N pauses over (M+N) refresh cycles. If BIST controller 112 determines that it should skip the next normal refresh cycle, then BIST controller asserts the MUX CONTROL signal, decoupling DRAM controller 108 from DRAM 106, a step 418. If BIST controller 112 determines that it should not skip the next normal refresh cycle, then BIST controller returns to step 404.

Continuing from step 418, BIST controller 112 then waits for the next attempted refresh cycle from DRAM controller 108, a step 420. BIST controller returns to step 402 after the next attempted refresh cycle.

Figure 5:
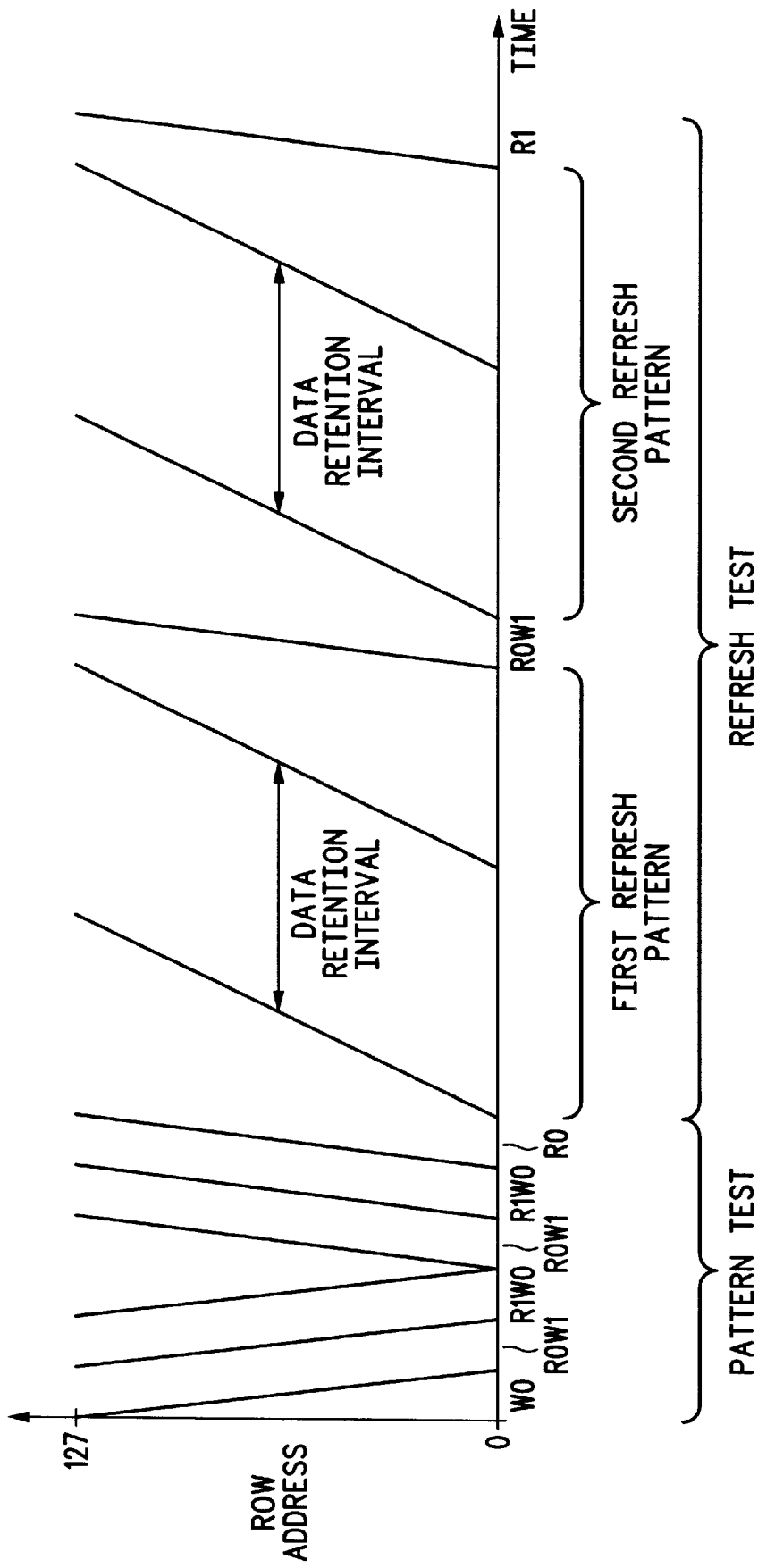
FIG. 5 depicts a graphical representation of the flow diagram steps depicted in FIG. 3.

FIG. 5 depicts a graphical representation of the flow diagram steps depicted in FIG. 3. FIG. 5 is useful in the illustration of BIST controller 112. In general, FIG. 5 depicts a pattern test followed by a refresh test. The left-hand portion of FIG. 5 depicts operations associated with the pattern test. The right-hand portion of FIG. 5 depicts operations associated with the data retention test.

The pattern test is made up of a series of reads and writes to array 132. Each series of reads and/or writes is represented by a sloping line. A positive slope indicates a series of reads and/or writes to ascending addresses in array 132. A negative slope indicates a series of reads and/or writes to descending addresses in array 132. Associated with each sloping line is a mnemonic. "R" and "W" indicate read and write operations, respectively. Both initials together indicate two operations to the same memory element. "0" and "1" represent a data pattern and its binary complement, respectively. As an example, BIST controller writes the pattern to each memory element beginning with element 127 and ending with element 0. Then, BIST controller 112 reads the pattern from each element, verifies its correctness, and writes the complementary pattern to the same address. BIST controller 112 again accesses array 132 in a descending order. The portion of FIG. 5 labeled "Pattern Test" depicts a single execution of step 306 illustrated in FIG. 3.

The data retention test is made up of a series of reads, writes and refreshes to array 132. Refresh sequences are identified by their lack of an R, W, etc. The refresh sequences are depicted with respect to their application to array 132. As described above, a greater number are generated by DRAM controller 108. Here, it is apparent that the first refresh test sequence uses the data stored in the last pattern test. As described above, interruptions are placed into the refresh sequence to decrease the effective refresh rate. In one embodiment, a relatively large gap may be inserted after some point in a set of refresh operation. In another embodiment, several relatively small gaps may be inserted into the refresh sequence. In either case, every row is refreshed with the same data retention interval. Each refresh sequence corresponds to one execution of step 312 in FIG. 3. Also, verification step 414 and set new pattern step 316 are depicted by the single atomic read-write line "ROWl" depicted between the first and second refresh pattern.

Figure 6:
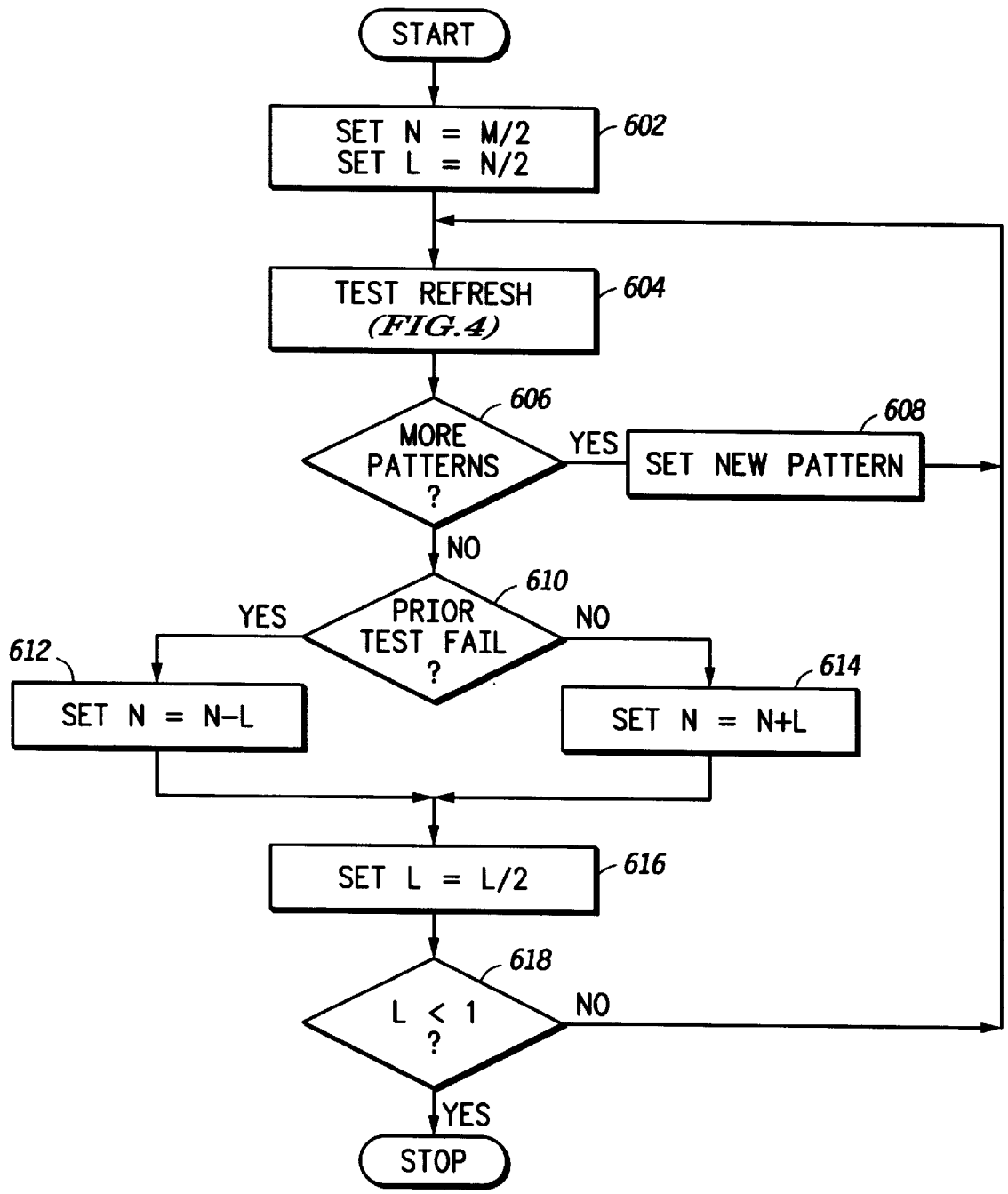
FIG. 6 depicts a flow diagram of the operation of the built-in self-test controller depicted in FIG. 1.

FIG. 6 depicts a flow diagram 600 of the operation of BIST controller 112 depicted in FIG. 1. Here, V equals one and S equals one. Also, M is set to the number of rows in array 132. Consequently, BIST controller 112 will perform a series of data retention tests to characterize the retention time of DRAM 106. Further, in this embodiment, BIST controller 112 uses a binary search algorithm to quickly determine the retention time.

Flow diagram 600 begins by setting an initial value of N equal to (M/2) and a value of an adjustment factor, L, to (N/2), a step 602. BIST controller 112 then performs a data retention test as illustrated in FIG. 4, a step 604. BIST controller 112 then determines if there are any more patterns to test at the same retention time, a step 606. If there are more patterns to test at the same retention time, then BIST controller 112 writes this new pattern into array 132, a step 608, and returns to step 604.

If there are no more patterns to test at the same retention time, then BIST controller 112 determines if there were any failures at the prior retention interval in any pattern, a step 610. If there was a failure at the prior retention interval, then BIST controller 112 reduces the retention interval by subtracting L from N, a step 612. If there were no failure at the prior retention interval, then BIST controller 112 increases the retention interval by adding L to N, a step 614. In either case, BIST controller 112 halves the adjustment factor L, a step 616. Next, BIST controller 112 determines if it has completed its binary search by comparing the adjustment factor, L, to 1. If the adjustment factor is one or greater, then the binary search is not complete. BIST controller 112 returns to step 604 and continues testing. If the adjustment factor is less than one, then the binary search is complete.

Figure 7:
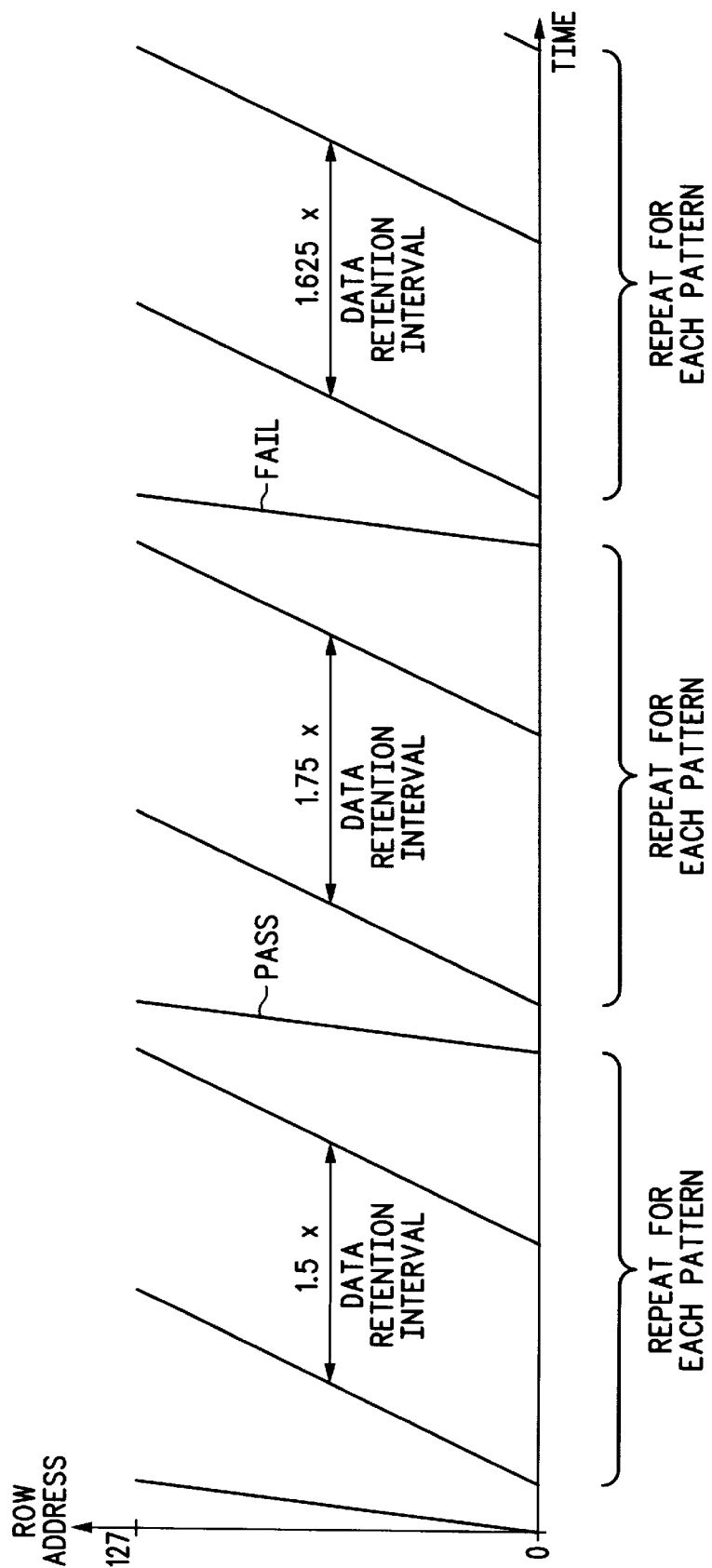
FIG. 7 depicts a graphical representation of the flow diagram steps depicted in FIG. 6.

FIG. 7 depicts a graphical representation of the flow diagram steps depicted in FIG. 6. BIST controller 112 initially sets N equal to half of one-hundred and twenty-eight. Therefore, BIST controller 112 initially blocks sixty-four refresh cycles out of every one hundred and ninety-two generated by DRAM controller 108. This strategy yields a retention test interval of 150% of the retention time provided by the normal refresh rate. In this example, this first retention test passes. BIST controller 112 then adjusts N by adding thirty-two. Therefore, BIST controller 112 blocks ninety-six refresh cycles out of every two hundred and twenty-four generated by DRAM controller 108 in the second retention test. This strategy yields a retention test interval of 175% of the retention time provided by the normal refresh rate. In this example, this second retention test fails. BIST controller 112 then adjusts N by subtracting sixteen. Therefore, BIST controller 112 blocks eighty refresh cycles out of every two hundred and eight generated by DRAM controller 108. This strategy yields a retention test interval of 162.5% of the retention time provided by the normal refresh rate. This process continues until the adjustment factor is less than one.

The foregoing description and illustrations contained herein demonstrate many of the advantages associated with the present invention. Although the invention has been described and illustrated with reference to specific embodiments thereof, it is not intended that the invention be limited to these illustrative embodiments. Those skilled in the art will recognize that modifications and variations can be made without departing from the spirit of the invention. For example, certain blocks may be integrated onto the same circuit. Conversely, functionality depicted as originating from the same circuit may be divided into two or more separate devices. Therefore, it is intended that this invention encompass all such variations and modifications as fall within the scope of the appended claims.

What is claimed is:

1. A method for verifying a data retention time in a dynamic random access memory (DRAM) using built-in test circuitry, comprising the steps of:
   providing a DRAM having a plurality of rows of memory cells, each row periodically requiring a refresh operation to retain valid data;
   providing refresh control circuitry coupled to the DRAM, the refresh control circuitry providing at least one signal to the DRAM which initiates the refresh operation of the DRAM, the DRAM requiring every row to periodically receive a refresh operation to satisfy a data retention time specification for the DRAM; and
   providing built-in test circuitry coupled to the refresh control circuitry and the DRAM, the built-in test circuitry dynamically determines a limit for reliable data retention of the DRAM by testing the DRAM with application of variable refresh rates until at least a first failure of data retention is encountered and scaling a rate of memory refresh at which the DRAM is being refreshed, the scaling being between a normal rate at which the refresh control circuitry initiates a refresh operation and a rate equal to the product of:

$1/(1+N/M)*\text{normal refresh rate}$, where N is less than M, and N and M are integers.

2. The method of claim 1 further comprising the step of:
   operating the built-in test circuitry as a finite state machine which is clocked by a clock signal having a frequency which does not affect or modify a test interval period for testing the data retention time of the DRAM.

3. The method of claim 1 wherein the step of providing the built-in test circuitry to scale the rate of memory refresh further comprises scaling to inhibit refreshing every N out of (M+N) refresh operations.

4. The method of claim 1 wherein the step of scaling the rate of memory refresh further comprises scaling to inhibit N times in every (M+N) refresh operations and further comprises using a programmable counter in which N and M are programmable by a user and the programmable counter implements, at least in part, the inhibiting.

5. The method of claim 1 wherein the step of providing the built-in test circuitry to scale the rate of memory refresh comprises inhibiting N times out of every (M+N) refresh operations and further comprises utilizing a counter to count a number of refresh operations.

6. The method of claim 1 wherein the step of enabling the built-in test circuitry to dynamically determine a limit for reliable data retention of the DRAM further comprises providing circuitry to report a limit to a controller of the refresh control circuitry in order to change a refresh interval to optimize performance of the DRAM.

7. A memory with data retention test capability, comprising:
   a dynamic random access memory (DRAM) array having rows and columns of memory cells, each one of the rows being specified to be refreshed within a predetermined refresh period;
   a DRAM controller coupled to the DRAM, the DRAM controller providing refresh signals to the DRAM to control timing of refreshing of data of each one of the rows of the DRAM; and
   test circuitry coupled to the DRAM, the test circuitry modifying the timing of refreshing of data by the DRAM controller with circuitry which selectively nullifies every N out of (M+N) DRAM refresh operations, where N is less than M, and N and M are integers, and thereby scales the DRAM refresh relative to the predetermined refresh period.

8. The memory of claim 7 wherein the test circuitry further comprises:
   a programmable counter coupled to the DRAM, the programmable counter counting values for N and M, where N is provided by a user of the memory.

9. A memory test circuit for testing data retention of a DRAM, comprising:
   test circuitry which electrically monitors data refresh signals provided to the DRAM, the test circuitry selectively nullifying every N out of (M+N) data refresh signals, where N is less than M, and N and M are integers, the test circuitry verifying a data retention time characteristic of the DRAM, the test circuitry being clocked by a clock signal having a frequency which does not affect or modify a test interval period for testing the data retention of the DRAM.

10. The memory test circuit of claim 9 wherein the test circuitry further comprises:
    a programmable circuit for permitting a user to program a value for N.

11. The memory test circuit of claim 9 wherein the test circuitry further comprises:
    a characterization circuit which provides a plurality of values of N from zero to (M−1), thereby permitting the memory test circuit to characterize limits of reliable data retention of the DRAM.

* * * * *